United States Patent
Mogi

[11] Patent Number: 5,395,254
[45] Date of Patent: Mar. 7, 1995

[54] IC SOCKET

[75] Inventor: Hiroyuki Mogi, Kawaguchi, Japan

[73] Assignee: Enplas Corporation, Japan

[21] Appl. No.: 140,597

[22] Filed: Oct. 21, 1993

[30] Foreign Application Priority Data

Oct. 23, 1992 [JP] Japan .............................. 4-084159 U

[51] Int. Cl.$^6$ ........................ H01R 9/09; H01R 13/62
[52] U.S. Cl. ........................................ 439/70; 439/71;
439/331; 439/518
[58] Field of Search ................ 439/170, 518, 70, 71,
439/73, 331, 525

[56] References Cited

U.S. PATENT DOCUMENTS

| | | | |
|---|---|---|---|
| 4,838,801 | 6/1989 | Bertoglio et al. | 439/66 X |
| 5,127,837 | 7/1992 | Shah et al. | 439/71 |
| 5,215,472 | 6/1993 | Del Prete et al. | 439/71 |

FOREIGN PATENT DOCUMENTS 58-150281  9/1983  Japan .
5-20286   3/1993  Japan .

Primary Examiner—Kenneth J. Ramsey
Attorney, Agent, or Firm—Graham & James

[57] ABSTRACT

An IC socket comprising a floating plate having a plurality of through holes and attached to a main body of the IC socket so as to be vertically movable, an adaptor plate having a plurality of through holes corresponding to the through holes of the floating plate and removably attached to the floating plate, intermediate contact members disposed in the through holes of the adaptor plate, and wire-like contact pins fixed to the main body and having free ends inserted into the through holes of the floating plate.

This IC socket is capable of mounting two types of IC packages selectively by attaching and removing the adaptor plate and the intermediate contact members to and from the floating plate.

5 Claims, 4 Drawing Sheets

IC SOCKET

BACKGROUND OF THE INVENTION a) Field of the Invention

The present invention relates to an IC socket which is applicable to both PGA (pin grid alley) type and LGA (land grid alley) type IC packages.

b) Description of the Prior Art

It is known that IC sockets are used for electrically connecting IC packages to printed circuit boards. However, it is necessary to prepare IC sockets which are to be used exclusively with the PGA type and the LGA type IC packages respectively since these IC packages have leads which are different in shapes thereof.

Illustrated in FIG. 1 is a PGA type IC package 1. This IC package consists of a main body 1a and a plurality of slender leads 1b. FIG. 2 exemplifies an IC socket which is configured for use with the PGA type IC package (disclosed by Japanese Patent Preliminary Publication No. Sho 58-150281). A lever 3 is pivoted to a main body 2 of the IC socket. A cover plate 4 which has a plurality of through holes 4a is slidably attached to the main body 2. Relationship for establishing electrical connection between contact pins 5 disposed on the main body 2 and the leads 1b is illustrated in a partial perspective view presented as FIG. 3, wherein only the through holes 4a are shown with the cover plate 4 omitted. Each of the contact pins 5 is disposed in a hole 2a formed in the main body 2 and has three contacts 5a, 5b and 5c.

For setting the PGA type IC package on the main body 2 of the IC socket described above, the leads 1b are inserted into the through holes 4a as illustrated in FIG. 3, wherein the leads 1b have not been yet brought into contact with the contacts 5a, 5b and 5c of the contact pins 5. When the lever 3 is rotated in a direction indicated by an arrow A in FIG. 2, the cover plate 4 is slid in a direction indicated by another arrow B. Accordingly, the leads 1b are moved by the through holes 4a, and firmly clasped by the contacts 5a, 5b and 5c, whereby the leads 1b are electrically connected to the contact pins 5.

Under the present circumstances, the leads on the IC packages are arranged at narrow pitches and manufactured thinner. Further, materials having low electrical resistance are selected for manufacturing the leads so that the IC packages will consume less electric power, and mechanical strength of the leads 1b tends to be lower. Due to the structure of the contact pins 5, however, the IC socket which is configured as described above hardly allows the holes 2a to have a smaller size, thereby posing a problem that the contact pins 5 can hardly be distributed at narrow pitches on the main body 2. Furthermore, there remains another problem that the leads 1b are bent or injured when they are brought into contact with the contacts 5a, 5b and 5c.

FIG. 4(a) shows an LGA type IC package 6. A lead 6b has a surface which is square, Flat and protrudes slightly from a main body 6a. FIG. 5 exemplifies an IC socket for use with the LGA type IC package (disclosed by Japanese Utility Model Preliminary Publication No. Hei 5-20206). Attached to a main body 7 of the IC socket is a floating plate 8 with a bolt 9 which allows vertical movement of the floating plate 8. A coil spring 10 urges the floating plate 8 upward. The floating plate 8 has a guide 8a mounted thereon and a plurality of through holes 8b formed therein. An intermediate plate 11 has a plurality of through holes 11a and is kept free from the main body 7. A plurality of wire-like contact pins 12 pass through the through holes 11a and have ends 12a which are located in the through holes 8b when an IC package 6 is not mounted on the IC socket. A cover 13 is attached to the main body 7 by a means which allows vertical movement of the cover and is urged upward by a coil spring 14. A link 15 is pivoted by a shaft 15a and has an end connected to the cover 13. Further, a holding means 15b is pivoted by a shaft 15c of the link 15. A locating board 16 which is to be mounted on a printed circuit board is disposed so as to be vertically movable relatively to the main body 7 and the other ends 12b of the contact pins 12 pass through a plurality of through holes 16a.

For setting the LGA type IC package 6 on the IC socket described above, the cover 13 is pushed down against elasticity of the spring 4. Upon pushing down the cover 13, the link 15 and the holding means 15b are moved from locations traced in the solid lines to the locations traced in the dashed lines. In this condition, the IC package 6 is mounted on the floating plate 8. A location of the IC package 6 is determined by the guide 8a. When the cover 13 is free from the pushing down force while keeping the IC package 6 in a condition where it is slightly pushed down, the cover 13 moves upward, whereby the link 15 and the holding means 15b return to the locations traced in the solid lines. Accordingly, the IC package 6 is set and held in position by the holding means 15b. In this condition, the floating plate 8 is slightly pushed down against the elasticity of the coil spring 10, whereby the ends 12a of the contact pins 12 attain to upper ends of the through holes 8b and are electrically connected to the leads 6b of the IC package 6. Though the contact pins 12 are flexed in this condition, they are free from undue stress and cannot be broken owing to the fact that the intermediate plate 11 is movable in the horizontal direction. Further, the through holes 11a serve for preventing the contact pins 12 from mutual contact thereof.

The IC socket for the LGA type IC package, which has the structure described above and uses the wire-like contact pins, exhibits a merit that it allows the contact pins 12 to be disposed at very narrow pitches on the floating plate 8. When the above-mentioned PGA type IC package is mounted on the IC socket which has the structure described above, however, it is very difficult to establish electrical connection securely between all of the leads 1b and the contact pins 12 due to the fact that the leads 1b and the contact pins 12 are thin. Attempts which were made to use thick contact pins 12 posed a problem that the leads 1b were injured due to a high contact pressure which was produced by flexing the contact pins 12.

SUMMARY OF THE INVENTION

A primary object of the present invention is to provide an IC socket which is capable of mounting both the PGA type and LGA type IC packages selectively only with exchanges of a small number of parts.

The IC socket according to the present invention comprises a floating means which has a plurality of through holes and is attached to a main body of the IC socket by way of an elastic means so as to be vertically movable; a cover means which has a pressing member for pushing an IC package downward against elasticity of the elastic means; an adaptor means which has a plurality of through holes corresponding to the through holes of the floating means and is removably attached to the floating means; a plurality of intermediate contact means which have upper end surfaces and lower end surfaces, and vertically movable in the through holes of the floating means so that the upper end surfaces are brought into contact with leads of the IC package; and a plurality of wire-like contact means which are fixed to the main body of the IC socket and have free ends inserted into the through holes of the floating means so as to be brought into contact with the lower end surfaces of the intermediate contact means: whereby the IC socket is configured so as to permit mounting another type of IC package by setting and removing the adaptor means and the intermediate contact means.

This and other objects as well as the features and the advantages of the present invention will become apparent from the following detailed description of the preferred embodiment when taken in conjunction with the accompanying drawings.

DETAILED DESCRIPTION OF THE PREFERRED EMBODIMENT

Figure 1:
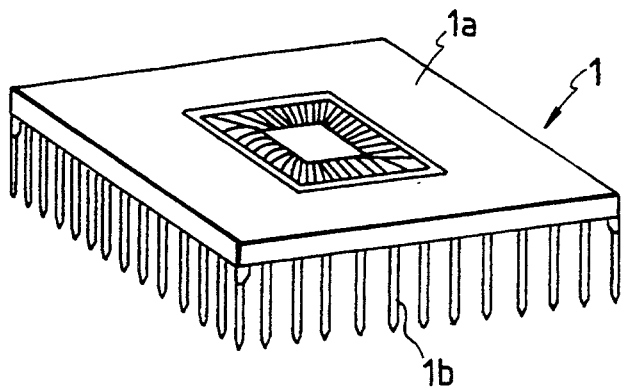
FIG. 1 is a perspective view illustrating the PGA type IC package.

Now, the IC socket according to the present invention will be described more detailedly below with reference to the preferred embodiment thereof illustrated in FIG. 6 through FIG. 9. For describing the embodiment of the present invention, the reference numerals used to represent the parts and members of the conventional examples shown in FIG. 1 through FIG. 5 will be employed for also parts and members of the embodiment which are the substantially same or quite similar to those of the conventional examples. Accordingly, no particular description will be made of these parts and members.

Figure 6:
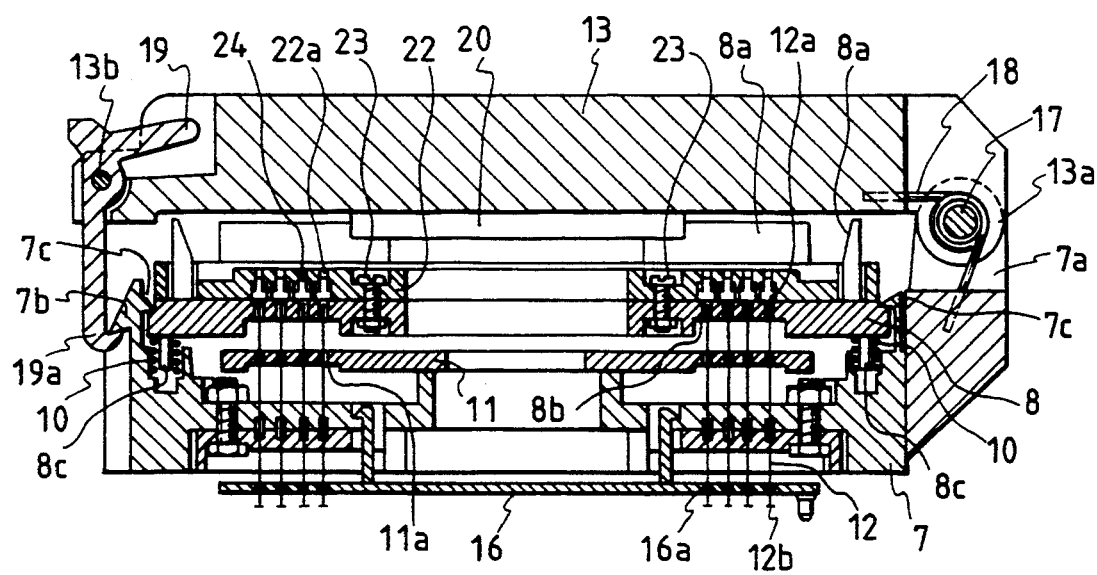
FIG. 6 is a sectional view illustrating an embodiment of the IC socket according to the present invention.

A main body 7 of the IC socket according to the present invention is made of a synthetic resin and has bearings 7a formed thereon. The bearings 7a and bearings 13a of a cover 13 are rotatably mounted on a shaft 17. The cover 13 is urged clockwise by a spring 18 as shown in FIG. 6. A claw lever 19 is rotatably mounted on another shaft 13b of the cover 13. In FIG. 6, a claw 19a of the claw lever 19 is engaged with a claw 7b of the main body 7. Pressing members 20 are attached to the cover 13 with screws 21.

A floating plate 8 has pins 8c and is urged upward by a coil spring 10, but claws 7c formed on the main body 7 prevent the floating plate 8 from actually moving upward. The claws 7c are flexible for allowing the floating plate 8 to be removed from the main body 7. The pins 8c serve for positioning the floating plate 8 when it is mounted on the main body 7.

An adaptor plate 22 is removably attached to the floating plate 8 by using bolts 23. Formed in the adaptor plate 22 are a plurality of through holes 22a at locations corresponding to those of the through holes 8b formed in the floating plate 8. As is seen from FIG. 8 which illustrates a portion of the IC socket on an enlarged scale, the through holes 22a are formed so as to have a diameter in lower sections thereof which is larger than that in the upper sections thereof, and an intermediate contact member 24 consisting of a small diameter section and a large diameter section is disposed in each of the through holes 22a so as to be movable in the vertical direction.

Figure 7:
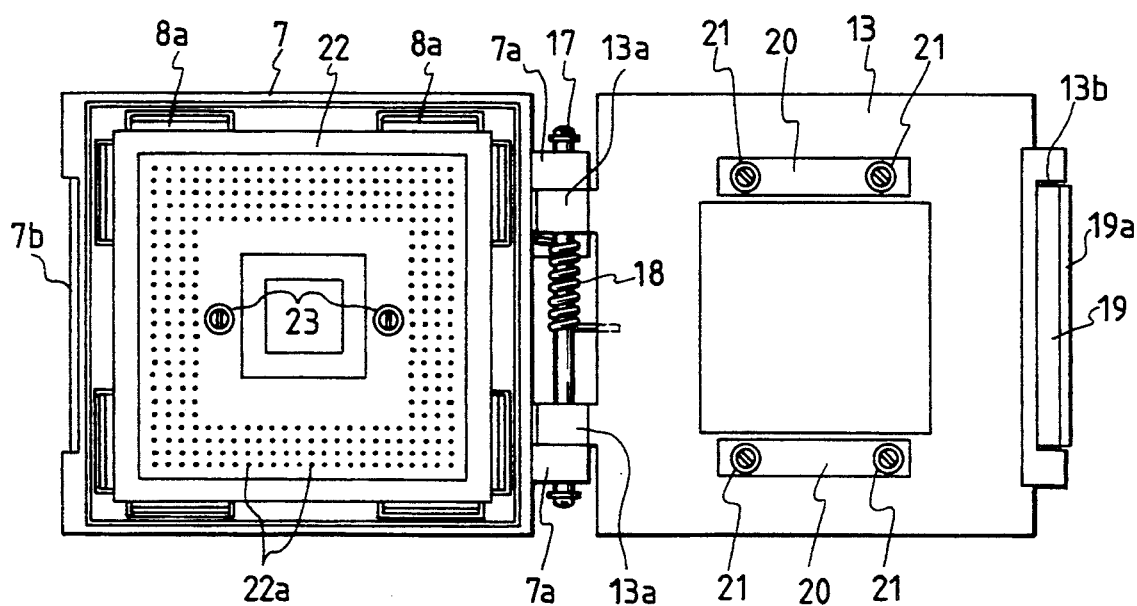
FIG. 7 is a plan view illustrating the embodiment of the present invention in a condition where it is uncovered.

When the claw 19a of the claw lever 19 is disengaged from the claw 7b of the main body 7 in the condition shown in FIG. 6, the spring 18 functions to open the cover 13 (see FIG. 7). The PGA type IC package 1 is mounted on the adaptor plate 22 from upside. In this condition, the leads 1b are inserted into the through holes 22a, but tips of the leads 1b are not brought into contact with the top surfaces of the intermediate contact members 24.

Figure 8:
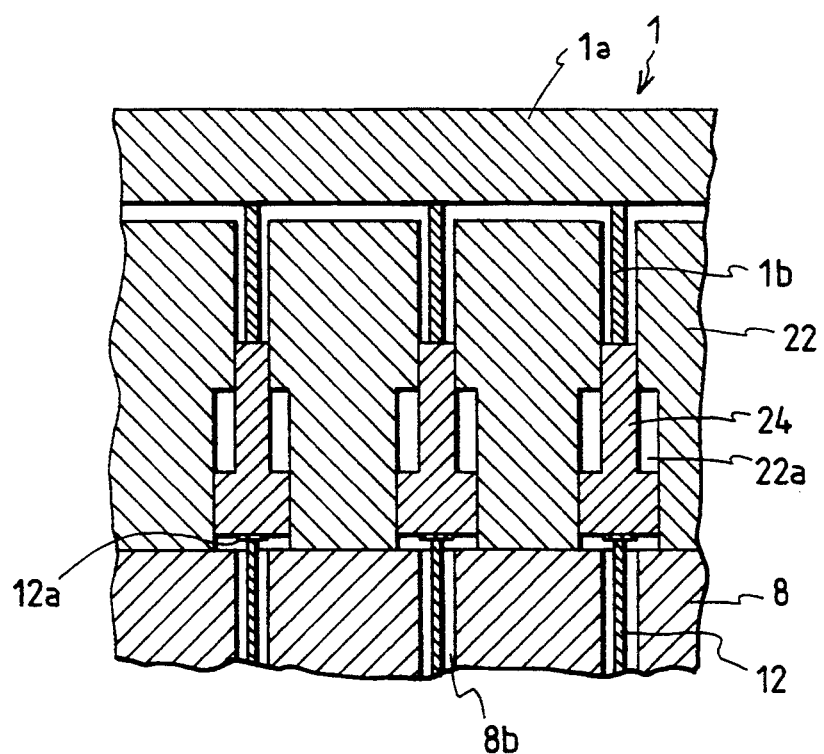
FIG. 8 is a sectional view illustrating, on an enlarged scale, a portion of the sectional view shown in FIG. 6.

When the cover 13 is closed as shown in FIG. 6, the pressing members 20 push the IC package 1 downward. Accordingly, the adaptor plate 22 and the floating plate 8 move downward against the elasticity of the coil springs 10. As a result, ends 12a of the wire-like contact pins 12 protrude from the through holes 8b and go into the through holes 22a. Since the ends 12a push the lower surfaces of the intermediate contact members 24 at this stage, the top surfaces of the intermediate contact members 24 are brought into contact with the tips of the leads 1b, whereby the leads 1b are electrically connected to the contact pins 12 by way of the intermediate contact members 24. This condition is shown in FIG. 8.

Figure 2:
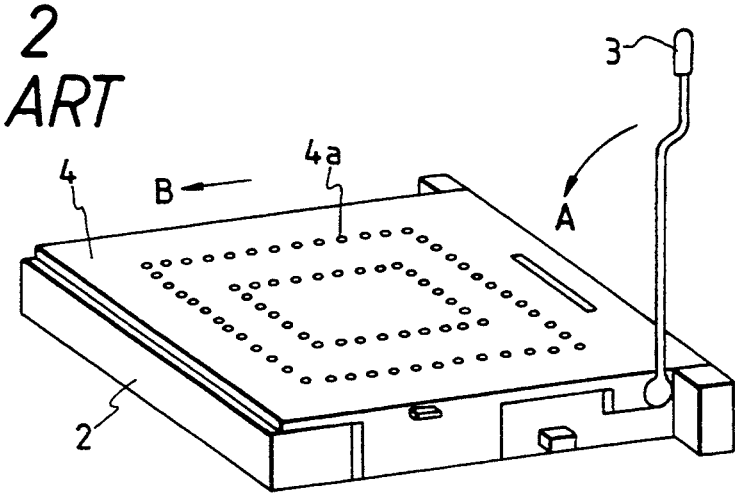
FIG. 2 is a perspective view illustrating a conventional example of IC socket for use with the PGA type IC package.
Figure 3:
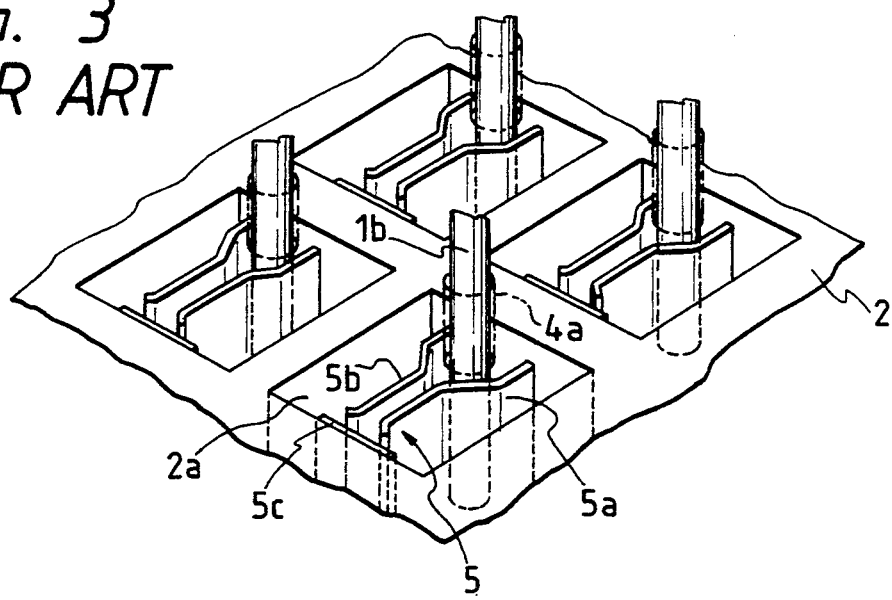
FIG. 3 is a perspective view illustrating relationship for establishing electrical connection between the contact pins of the IC socket and the leads of the PGA type IC package shown in FIG. 2.
Figure 4A:
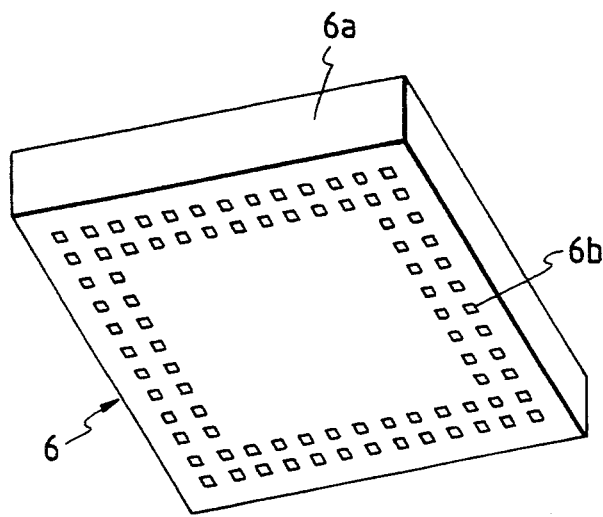
FIG. 4(a) is a perspective view illustrating the LGA type IC package.
Figure 4B:
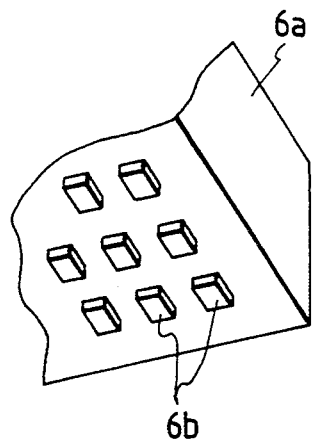
FIG. 4(b) is a view illustrating, on an enlarged scale, a portion of the IC package shown in FIG. 4(a)
Figure 5:
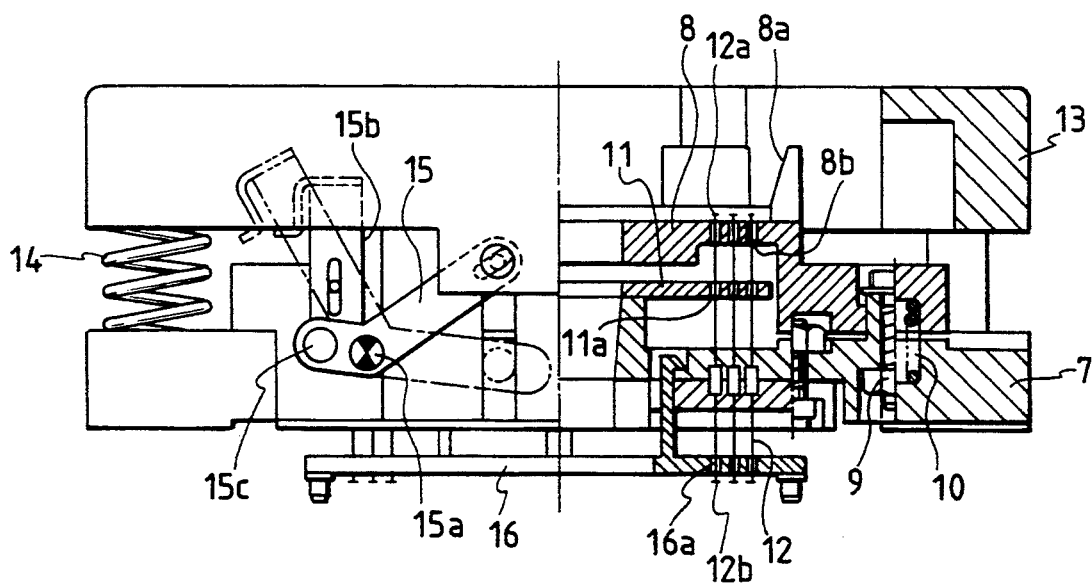
FIG. 5 is a sectional view illustrating a conventional example of IC socket for the LGA type IC package.
Figure 9:
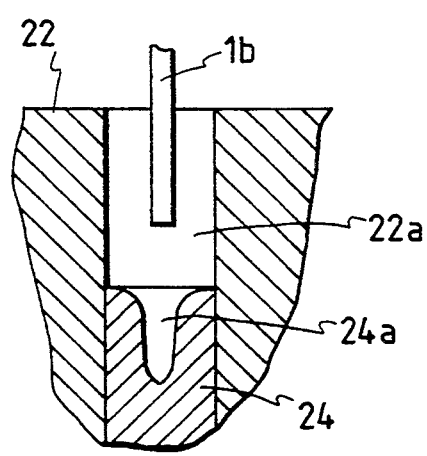
FIG. 9 is a sectional view illustrating another example of the intermediate contact member shown in FIG. 8.

As is understood from the foregoing description, the IC socket according to the present invention, which is configured so as to establish electrical connection between the leads 1b and the contact pins 12 by utilizing the vertical movements of the intermediate contact members 22, is applicable to the PGA type IC package having the leads disposed at narrow pitches, unlike the conventional IC socket utilizing the horizontal movements as shown in FIG. 2 and FIG. 3. For the IC socket according to the present invention, it is desirable that the intermediate contact members 24 are as short as possible so as to have electrical resistance as low as possible. When it is feared that electrical contact may be poor between the top surfaces of the intermediate contact members 24 and the leads 1b due to films of oxides formed on the top surfaces of the intermediate contact members 24, it will be preferable to form tapered holes 24a in the top surfaces of the intermediate contact members 24 as illustrated in FIG. 9 so that the tips of the leads 1b will make frictional contact with the intermediate contact members 24.

For mounting the LGA type IC package 6 on the IC socket according to the present invention, the cover 13 is opened in the condition shown in FIG. 6 and the claws 7c disengaged, whereafter the floating plate 8 and the adaptor plate 22 are removed from the main body 7. Then, the floating plate 8 is separated from the adaptor plate 22 by unscrewing the bolts 23 and only the floating plate 8 is attached to the main body 7 by using the claws 7c. Further, heights of the pressing members 20 are adjusted by loosening the screws 21. The pressing members 20 may be exchanged with other pressing members having a different size for adjusting the heights.

When the LGA type IC package 6 is mounted on the floating plate 8 in this condition and the cover 13 is closed, the floating plate 8 moves downward against the elasticity of the springs 10. At this stage, the tips 12a of the contact pins 12 attain to the upper end surfaces of the through holes 8b and are brought into contact with leads 6b, whereby the contact pins 12 are electrically connected to the leads 6b.

For configuring the IC socket so as to permit mounting the LGA type IC package 6, the floating plate 8 may be made inseparable from the adaptor plate 22 and exchangeable with another floating plate. Further, when the floating plate 8 is fixed to the adaptor plate 22 by using screws in place of the bolts 23 shown in FIG. 6, the LGA type IC package can be mounted simply by removing the adaptor plate 22 only.

What is claimed is:

1. An IC socket for electrically connecting an IC package to a printed circuit board capable of selectively mounting two types of IC packages comprising:

a floating means having a plurality of through holes and attached to a main body of the IC socket by way of an elastic means so as to be vertically movable, a cover means having pressing members for pushing an IC package downward against elasticity of said elastic means, an adaptor means having a plurality of through holes corresponding to the through holes of said floating means and removably attached to said floating means, a plurality of intermediate contact means having upper end surfaces and lower end surfaces, vertically movable in the through holes of said floating means and configured so as to allow said upper end surfaces to be brought into contact with leads of said IC package, and a plurality of wire-like contact means fixed to said main body of the IC socket, and having free ends inserted into the through holes of said floating means so as to be brought into contact with the lower end surfaces of said intermediate contact means.

2. An IC socket according to claim 1 wherein said floating means is removably attached to said main body of the IC socket.

3. An IC socket according to claim 2 wherein said adaptor means is inseparably attached to said floating means.

4. An IC socket according to any one of claims 1 through 3 wherein said intermediate contact means are formed so as to have areas on the lower end surfaces thereof larger than those on the upper end surfaces thereof.

5. An IC socket according to any one of claims 1 through 3 wherein said intermediate contact means are formed so as to have areas on the lower end surfaces thereof larger than those on the free ends of said contact means.

* * * * *